United States Patent
Yeh et al.

(10) Patent No.: US 9,437,434 B2
(45) Date of Patent: Sep. 6, 2016

(54) SEMICONDUCTOR DEVICE AND FABRICATION METHOD THEREOF

(71) Applicant: TAIWAN SEMICONDUCTOR MANUFACTURING COMPANY, LTD., Hsinchu (TW)

(72) Inventors: Ming-Hsi Yeh, Hsinchu (TW); Tsung-Chieh Tsai, Chu-Bei (TW); Chun-Yi Lee, Beipu Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/220,680

(22) Filed: Mar. 20, 2014

(65) Prior Publication Data

US 2014/0203372 A1 Jul. 24, 2014

Related U.S. Application Data

(63) Continuation of application No. 13/280,770, filed on Oct. 25, 2011, now Pat. No. 8,703,594.

(51) Int. Cl.
*H01L 21/28* (2006.01)
*H01L 27/088* (2006.01)
*H01L 27/092* (2006.01)
*H01L 21/8238* (2006.01)
*H01L 27/02* (2006.01)

(52) U.S. Cl.
CPC . *H01L 21/28008* (2013.01); *H01L 21/823807* (2013.01); *H01L 21/823814* (2013.01); *H01L 21/823828* (2013.01); *H01L 21/823878* (2013.01); *H01L 27/0207* (2013.01); *H01L 27/088* (2013.01); *H01L 27/092* (2013.01)

(58) Field of Classification Search
CPC .... H01L 21/28; H01L 27/088; H01L 27/092
USPC ....... 257/369, 338, 357, 407, 750, 752, 754; 438/585, 157, 199, 230, 283
See application file for complete search history.

(56) References Cited

U.S. PATENT DOCUMENTS

| | | | |
|---|---|---|---|
| 6,130,139 A * | 10/2000 | Ukeda et al. | 438/424 |
| 6,365,474 B1 * | 4/2002 | Finder et al. | 438/305 |
| 6,373,109 B1 | 4/2002 | Ahn | |
| 6,835,989 B2 | 12/2004 | Lin et al. | |
| 6,870,230 B2 * | 3/2005 | Matsuda et al. | 257/365 |
| 7,064,038 B2 | 6/2006 | Kudo et al. | |
| 7,663,237 B2 * | 2/2010 | Peng et al. | 257/750 |
| 7,786,518 B2 * | 8/2010 | Chakravarthi et al. | 257/288 |
| 7,816,213 B2 | 10/2010 | Matsuki | |
| 2004/0132239 A1 | 7/2004 | Lin et al. | |
| 2004/0142546 A1 | 7/2004 | Kudo et al. | |
| 2007/0221970 A1 | 9/2007 | Kadoshima et al. | |
| 2010/0087038 A1 * | 4/2010 | Chung et al. | 438/199 |
| 2010/0140708 A1 | 6/2010 | Hill et al. | |
| 2010/0184260 A1 * | 7/2010 | Luo et al. | 438/154 |

* cited by examiner

*Primary Examiner* — Sheng Zhu
(74) *Attorney, Agent, or Firm* — Hauptman Ham, LLP

(57) ABSTRACT

A semiconductor device includes an inter-layer dielectric (ILD) layer over a substrate; and a first gate feature in the ILD layer, the first gate feature comprising a first gate material and having a first resistance, wherein the first gate material comprises a first conductive material. The semiconductor device further includes a second gate feature in the ILD layer, the second gate feature comprising a second gate material and having a second resistance higher than the first resistance, wherein the second material comprises at least 50% by volume silicon oxide.

20 Claims, 10 Drawing Sheets

US 9,437,434 B2

SEMICONDUCTOR DEVICE AND FABRICATION METHOD THEREOF

PRIORITY CLAIM

The present application is a continuation of U.S. application Ser. No. 13/280,770, filed Oct. 25, 2011, which is incorporated herein by reference in its entirety.

FIELD

The disclosure relates to integrated circuit fabrication, and more particularly to a semiconductor device with a strained structure.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. The MOSFET processes comprise a "gate last" process to replace an original poly-silicon gate electrode with the metal gate electrode to improve device performance.

However, there are challenges to implement such features and processes in complementary metal-oxide-semiconductor (CMOS) fabrication. As the gate length and spacing between devices decrease, these problems are exacerbated. For example, it is difficult to prevent parasitic capacitance among gate stacks of the MOSFET because of the reduced spacing between the gate stacks, thereby affecting the device performance.

Accordingly, what is needed is an improved method for fabricating the gate stacks in a semiconductor device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
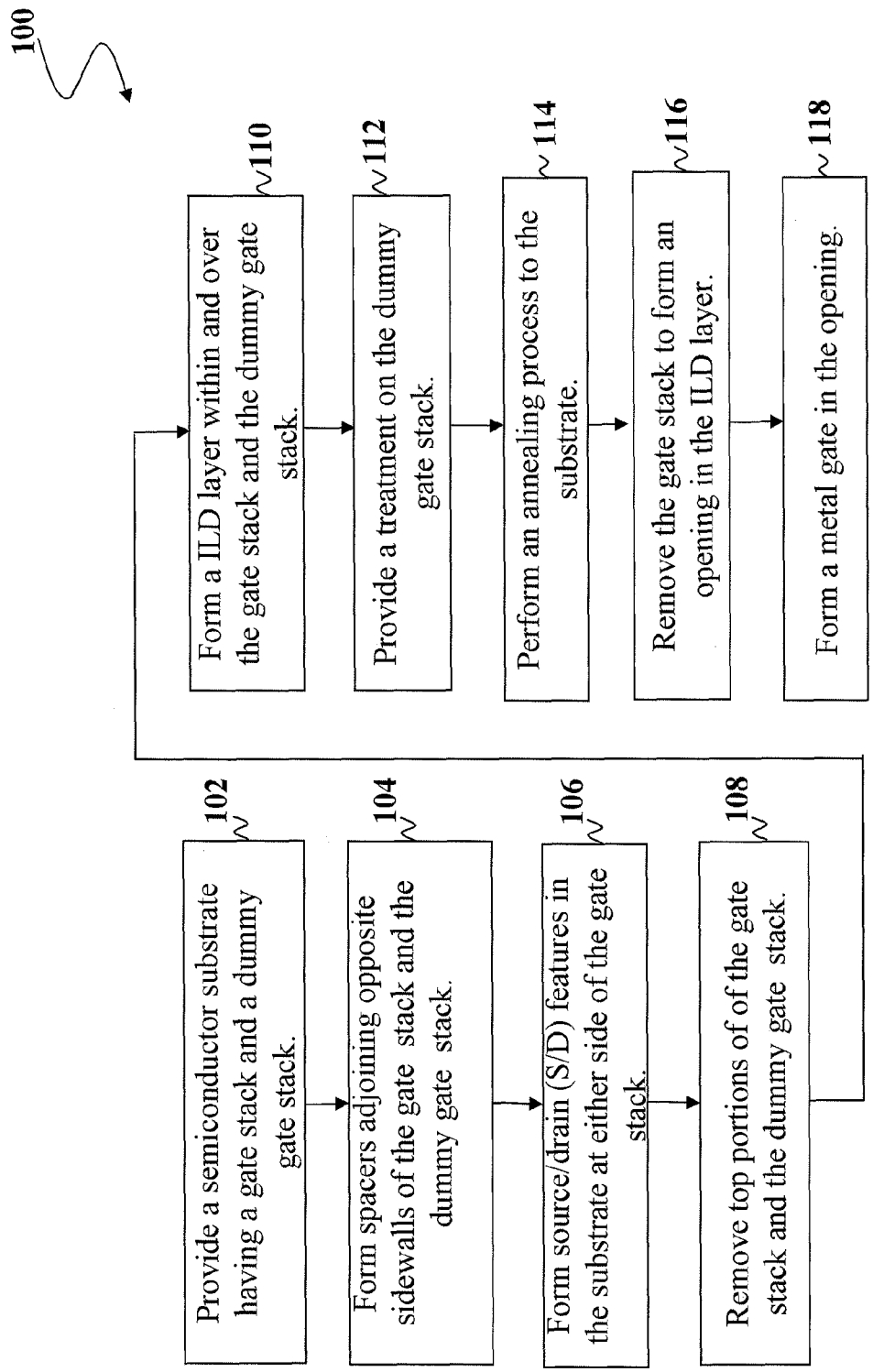
FIG. 1 is a flowchart illustrating a method for fabricating a semiconductor device comprising gate stacks according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device according to various aspects of the present disclosure. FIGS. 2-10 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
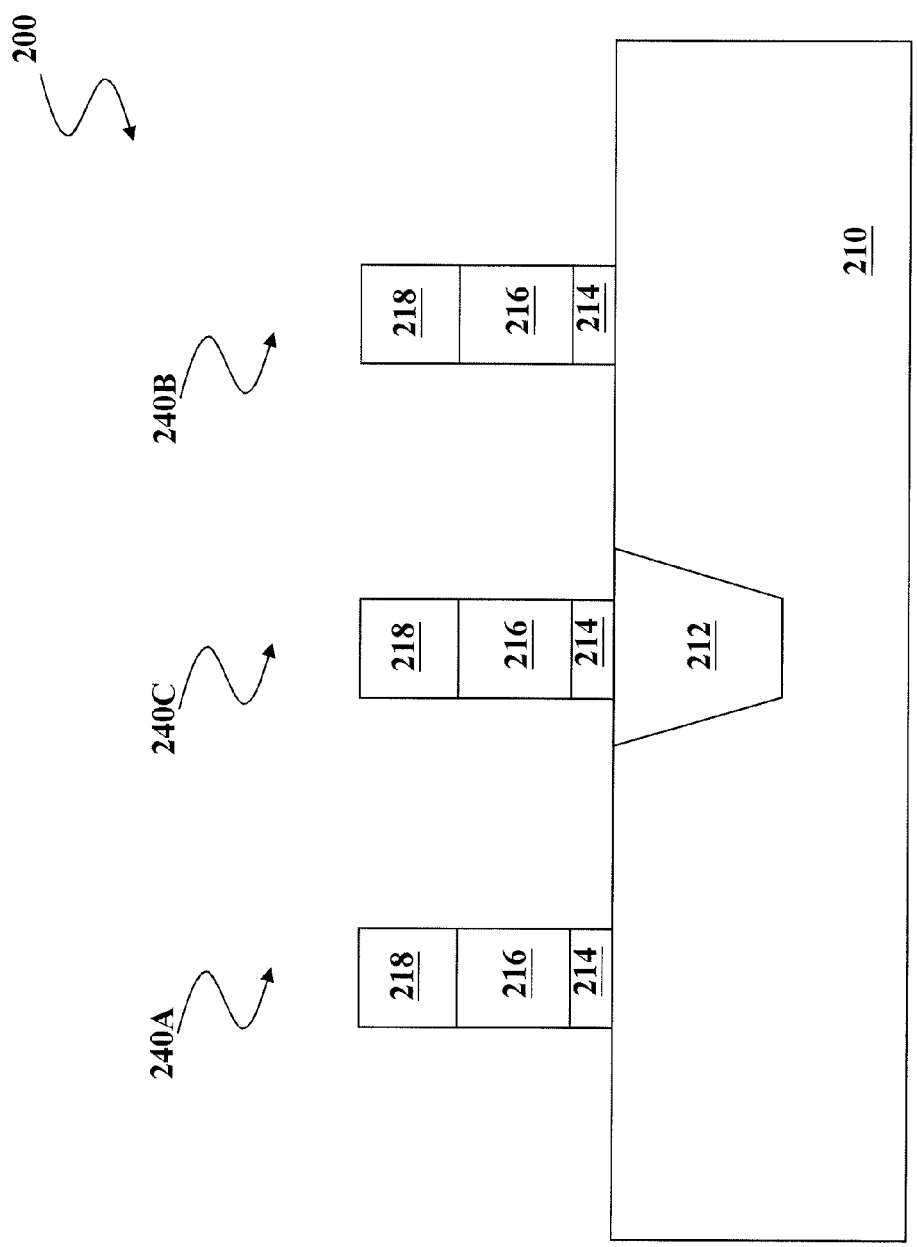
FIGS. 2-10 show schematic cross-sectional views of the gate stacks of a semiconductor device at various stages of fabrication according to various aspects of the present disclosure.

Referring to FIGS. 1 and 2, the method 100 begins at step 102 wherein a substrate 210 is provided. In one embodiment, the substrate 210 comprises a crystalline silicon substrate (e.g., wafer). In an alternative embodiment, the substrate 210 may include a silicon-on-insulator (SOI) structure. The substrate 210 may further comprise active regions (not shown). The active regions may include various doping configurations depending on design requirements as known in the art. In some embodiments, the active regions may be doped with p-type or n-type dopants. For example, the active regions may be doped with p-type dopants, using a chemical such as boron or $BF_2$ to perform the doping; n-type dopants, using a chemical such as phosphorus or arsenic to perform the doping; and/or combinations thereof. The active regions may act as regions configured for an N-type metal-oxide-semiconductor transistor device (referred to as an NMOS) and regions configured for a P-type metal-oxide-semiconductor transistor device (referred to as a PMOS).

In some embodiments, an isolation structure 212 is formed in the substrate 210 to isolate the various active regions. The isolation structure 212, for example, is formed using isolation technology, such as local oxidation of silicon (LOCOS) or shallow trench isolation (STI), to define and electrically isolate the various active regions. In the present embodiment, the isolation structure 212 includes an STI. The isolation structure 212 may comprise silicon oxide, silicon nitride, silicon oxynitride, fluoride-doped silicate glass (FSG), a low-K dielectric material, other suitable materials known in the art, and/or combinations thereof. The isolation structure 212may be formed by any suitable process. As one example, the formation of an STI may include patterning the semiconductor substrate 210 by a photolithography process, etching a trench in the substrate 210 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in at least one embodiment, gate stacks 240A, 240B, and 240C are formed over the surface of the substrate 210. In the present embodiment, the gate stacks 240A, 240B are designed for forming active devices, and the gate stack 240C is a dummy gate stack. In the present embodiment, the dummy gate stack 240C is over the isolation structure 212 and between gate stacks 240A and 240B. In some embodiments, each of the gate stacks 240A, 240B, and the dummy gate stack 240C comprises, in order, a gate dielectric feature 214, a gate electrode feature 216, and a hard mask feature 218 over the substrate 210. In some embodiments, a gate dielectric layer (not shown), a gate electrode layer (not shown), and a hard mask layer (not shown) are sequentially deposited over the substrate 210. Then, a patterned photo-sensitive layer (not shown) is formed over the hard mask layer. The pattern of the photo-sensitive layer is transferred to the hard mask layer and then transferred to the gate electrode layer and gate dielectric layer to form the gate stacks 240A, 240B, and the dummy gate stack 240C. The photo-sensitive layer is stripped thereafter by a dry and/or wet stripping process.

The gate dielectric feature 214, in one example, is a thin film comprising silicon oxide, silicon nitride, silicon oxynitride, high-k dielectrics, other suitable dielectric materials known in the art, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric feature 214 comprises a high-k dielectric layer with a thickness in the range of about 10 angstroms to about 30 angstroms. The gate dielectric feature 214 may be formed using a suitable process such as atomic layer deposition (ALD), chemical vapor deposition (CVD), physical vapor deposition (PVD), thermal oxidation, UV-ozone oxidation, or combinations thereof. An interfacial layer (not shown) may further be included under the gate dielectric feature 214 to reduce the likely damage between the gate dielectric feature 214 and the substrate 210. The interfacial layer may comprise silicon oxide.

In some embodiments, the gate electrode feature 216 over the gate dielectric feature 214 comprises a single layer or multilayer structure. In the present embodiment, the gate electrode feature 216 may comprise poly-silicon. Further, the gate electrode feature 216 may be doped poly-silicon with doping species. In one embodiment, the gate electrode feature 216 has a thickness in the range of about 30 nm to about 60 nm. The gate electrode feature 216 may be formed using a process such as low-pressure chemical vapor deposition (LPCVD); plasma enhanced chemical vapor deposition (PECVD), other suitable processes, or combinations thereof. In one embodiment, silane ($SiH_4$) is used as a chemical gas in the CVD process to form the gate electrode feature 216. In other embodiments, the gate electrode feature 216 and/or the gate dielectric feature 214 may be sacrificial layers and will be removed by a replacement step in the subsequent processes.

In some embodiments, the hard mask feature 218 over the gate electrode feature 216 comprises silicon oxide. Alternatively, the hard mask feature 218 may comprise silicon nitride, silicon oxynitride, and/or other suitable dielectric materials, and may be formed using a method such as CVD or PVD. In some embodiments, the hard mask feature 218 has a thickness in the range from about 100 angstroms to about 800 angstroms.

Figure 3:
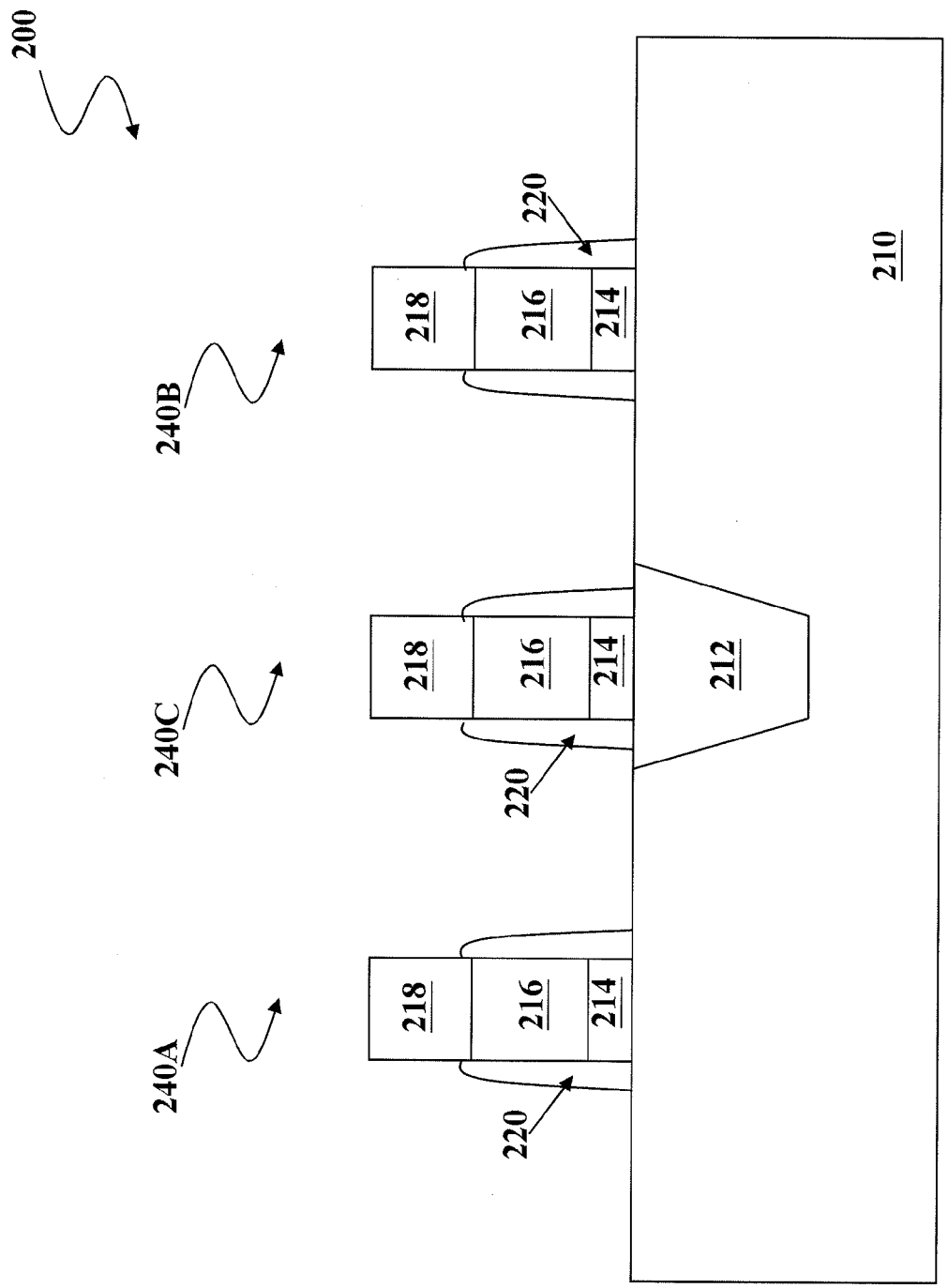

Referring to FIGS. 1 and 3, the method 100 proceeds to step 104 wherein gate spacers 220 are formed adjoining opposite sidewalls of the gate stacks 240A, 240B, and the dummy gate stack 240C. In some embodiments, the gate spacers 220 may include a single-layer or a multiple-layer structure. In the present embodiment, a blanket layer of spacer material (not shown) is formed within and over the gate stacks 240A, 240B, and the dummy gate stack 240C by a depositing process including CVD, PVD, ALD, or other suitable techniques. In some embodiments, the spacer material comprises silicon oxide, silicon nitride, silicon oxynitride, other suitable material, or combinations thereof. In some embodiments, the spacer material has a thickness ranging from about 5 nm to about 15 nm. Then, an anisotropic etching process is performed on the spacer material to form the gate spacers 220. In some embodiments, the gate spacers 220 have a height less than the height of the gate stacks 240A, 240B, and the dummy gate stack 240C. In an embodiment, the gate spacers 220 are adjoining sidewalls of the gate dielectric feature 214 and the gate electrode feature 216, but expose sidewalls of the hard mask feature 218.

Figure 4:
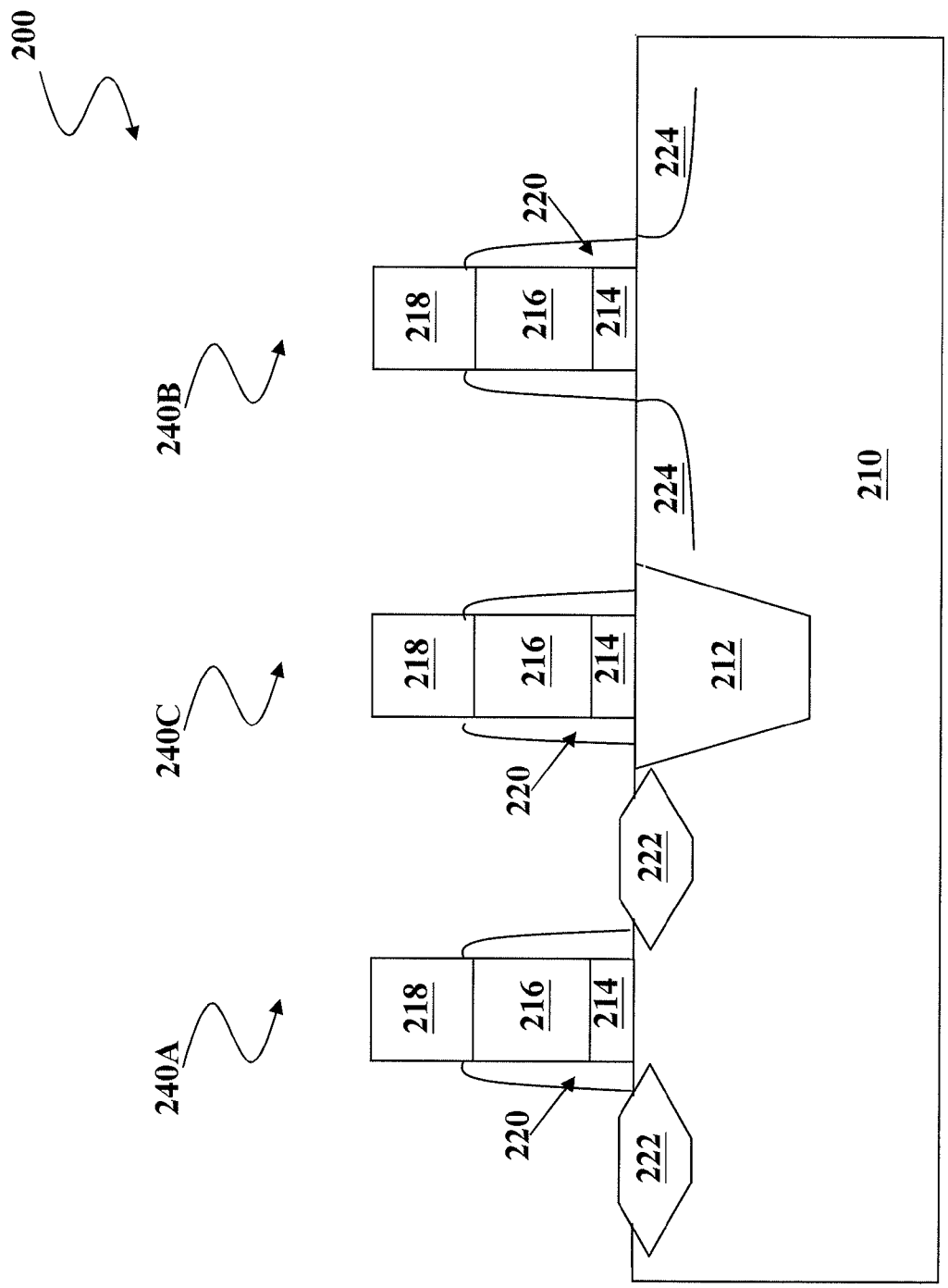

Referring to FIGS. 1 and 4, the method 100 continues with step 106 in which source/drain (S/D) features 222, 224 are formed in the substrate 210. In one embodiment, the source/drain (S/D) features 222 are configured to the gate stack 240A for PMOS device, and the source/drain (S/D) features 224 are configured to the gate stack 240B for NMOS device. The formation processes of the S/D features 222 may start from forming recess cavities (not shown) at either side of the gate stack 240A in the substrate 210. In the present embodiment, the recess cavities are formed using an isotropic dry etching process and then followed by an anisotropic wet or dry etching process. In embodiments, a strained material is grown to fill in the recess cavities to form the S/D features 222. In some embodiments, the growth process of the strained material comprises selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes known in the art, or combinations thereof. In some embodiments, the strained material is silicon germanium (SiGe). In some embodiments, the strained material is epi SiGe with p-type dopants, such as boron.

In an embodiment, the S/D features 224 are formed at either side of the gate stack 240B in the substrate 210 by one or more ion implantation processes. The implantation, for example, is performed using n-type dopants, such as phosphorus or arsenic, under designed implantation energy and tilt angle to meet the requirements of device performance. In an alternative embodiment, the S/D features 224 include epi silicon (Si) with n-type dopants. Processes for forming the epi Si may include some etching processes for forming recess cavities (not shown) in the substrate 210 and then filling the recess cavities with the epi Si. The growth process of the epi Si comprises SEG, CDE, CVD techniques, MBE, other suitable epi processes known in the art, or combinations thereof.

Figure 5:
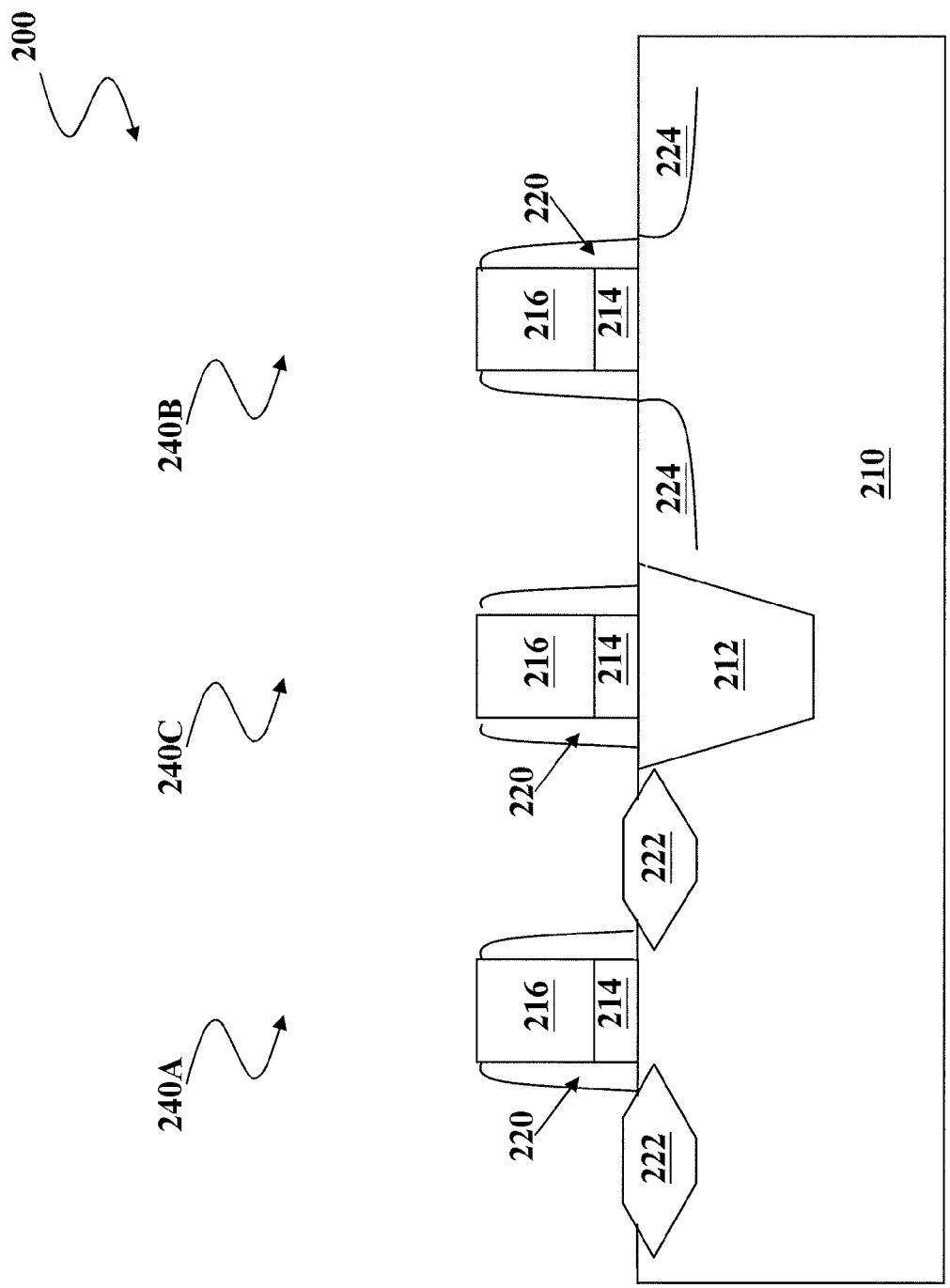

Referring to FIGS. 1 and 5, the method 100 continues with step 108 in which the hard mask feature 218 is removed from the gate stacks 240A, 240B, and the dummy gate stack 240C by an etching process. The etching process may include, for example, using a dry etching, wet etching, and/or plasma etching process. In some embodiments, the etching process is performed using $NF_3$ gas and/or argon gas, with flow rates ranging from about 10 sccm to about 100 sccm and from about 10 sccm to about 200 sccm, respectively. In some embodiments, the first step of the etching process is performed with a RF bias greater than about 60V, under a vacuum pressure ranging from about 10 mTorr to about 100 mTorr. In some embodiments the RF bias is between about 60V and about 200V. The step of removing the hard mask feature 218 may reduce the heights of the gate stacks 240A, 240B, and the dummy gate stack 240C; therefore, reducing the aspect ratio of the gaps between the gate stacks 240A, 240B, and the dummy gate stack 240C. The reduced aspect ratio is helpful for a subsequent gap filling process.

Figure 6:
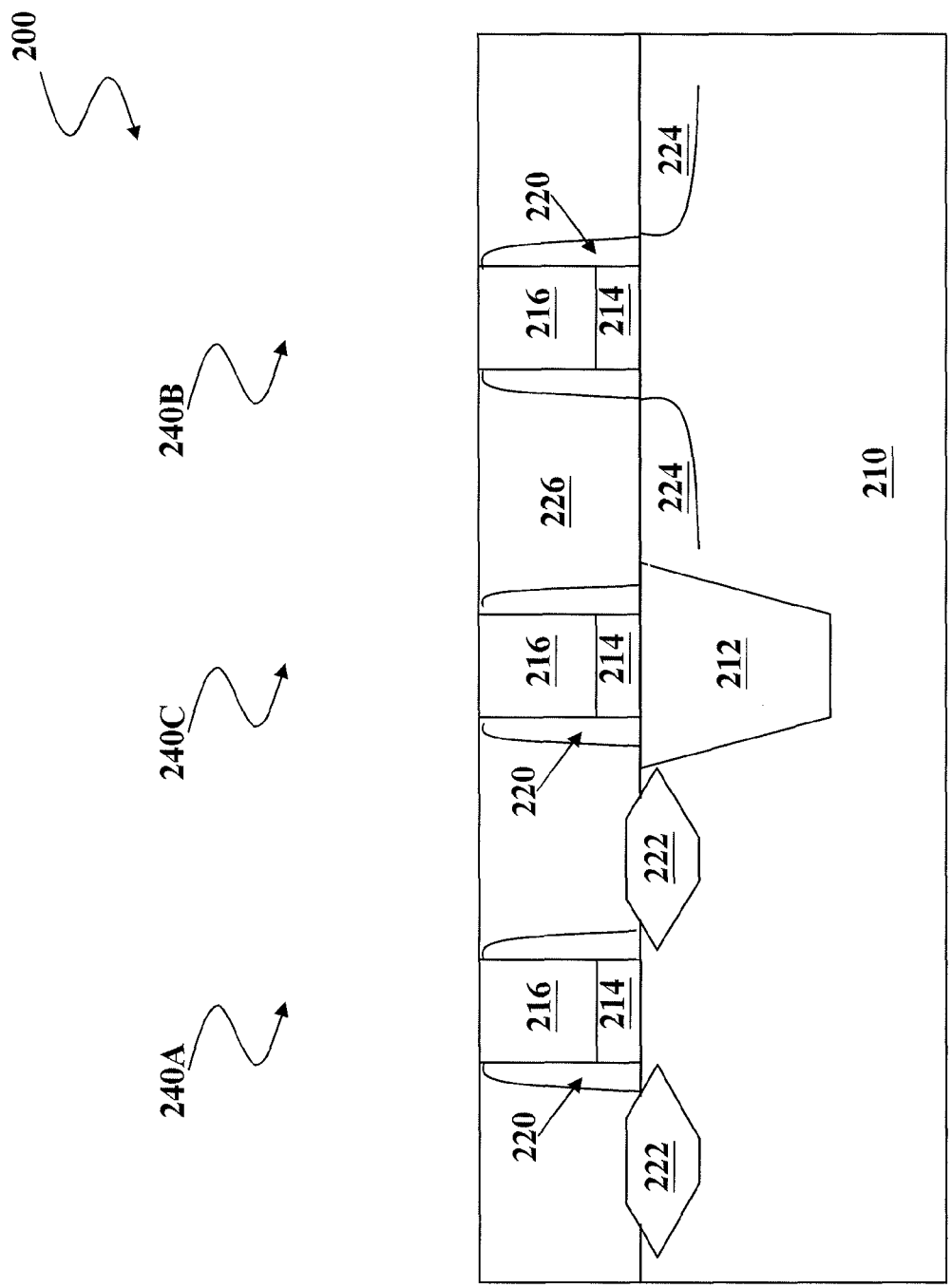

Referring to FIGS. 1 and 6, the method 100 continues with step 110 in which an interlayer dielectric (ILD) 226 is formed within the gate stacks 240A, 240B and the dummy gate stack 240C. The ILD 226 may include materials such as oxide, nitride, oxynitride, low-k dielectric material, ultra low-k dielectric material, extreme low-k dielectric material, other dielectric material, and/or combinations thereof. In some embodiments, the ILD 226 is formed by depositing an ILD layer (not shown) within and over the gate stacks 240A, 240B and the dummy gate stack 240C, then, applying a planarization process to remove the portion of ILD layer over the gate stacks 240A, 240B and the dummy gate stack 240C. In some embodiments, the step of depositing the ILD layer comprises a CVD process, a HDP CVD process, a HARP, a spin-coating process, other deposition process, and/or any combinations thereof. In some embodiments, the planarization process includes a chemical-mechanical polish (CMP) process, a dry etch process, a wet etch process, and/or combinations thereof. The planarization process may form the ILD 226 with a top surface substantially co-planer with the top surface of the gate stacks 240A, 240B and the dummy gate stack 240C.

Figure 7:
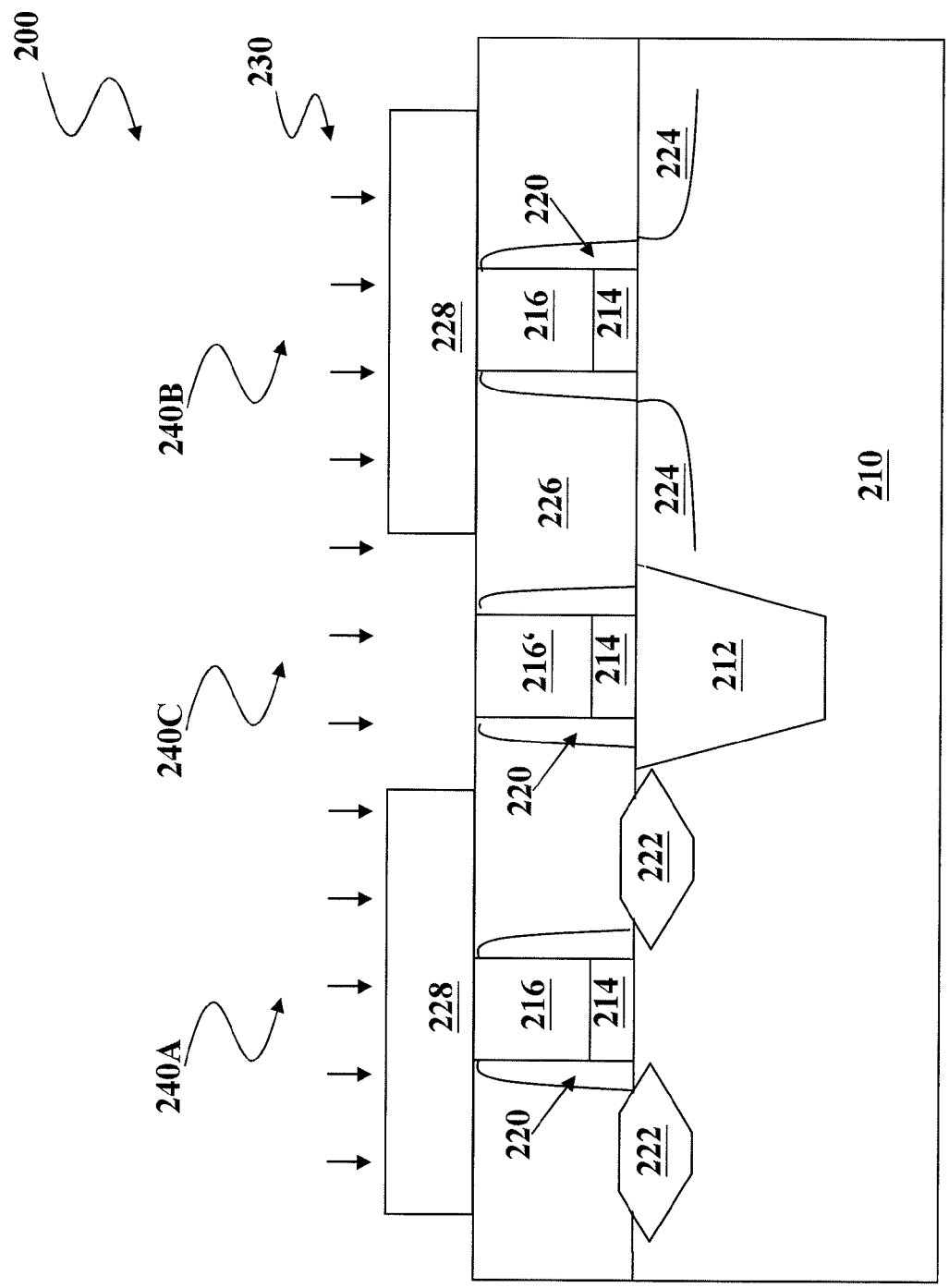

Referring to FIGS. 1 and 7, the method 100 continues with step 112 in which a treatment 230 is provided to a dummy gate stack 240C, thereafter, the gate electrode feature 216 is transformed to a treated gate electrode feature 216'. The energy source of the treatment 230 can be provided by an ion implantation process, or other suitable processes known in the art including thermal diffusion, plasma, e-beam, ultraviolet (UV), or combinations thereof. In embodiments, the treatment 230 introduces oxygen-containing species, comprising $O_2$, $O_3$, $CO_2$, or combinations thereof, into the gate electrode feature 216 to form the treated gate electrode feature 216'. In one embodiment, the oxygen-containing species is distributed within the entire treated gate electrode feature 216'. In an alternative embodiment, at least 50% volume of the treated gate electrode feature 216' contains the oxygen-containing species. In some embodiments, the treatment 230 is an ion implantation process performed at an energy ranging between about 2 KeV to about 20 KeV. In some embodiments, the treatment 230 is an ion implantation process performed with a dosage ranging between about 1E13 atoms/cm$^2$ and about 1E17 atoms/cm$^2$. The gate stacks 240A, 240B are not transformed by the treatment 230 because gate stacks 240A and 240B are covered by protectors 228, e.g., photoresist patterns. In some embodiments, the protectors 228 are removed by a stripping process after the treatment 230.

Figure 8:
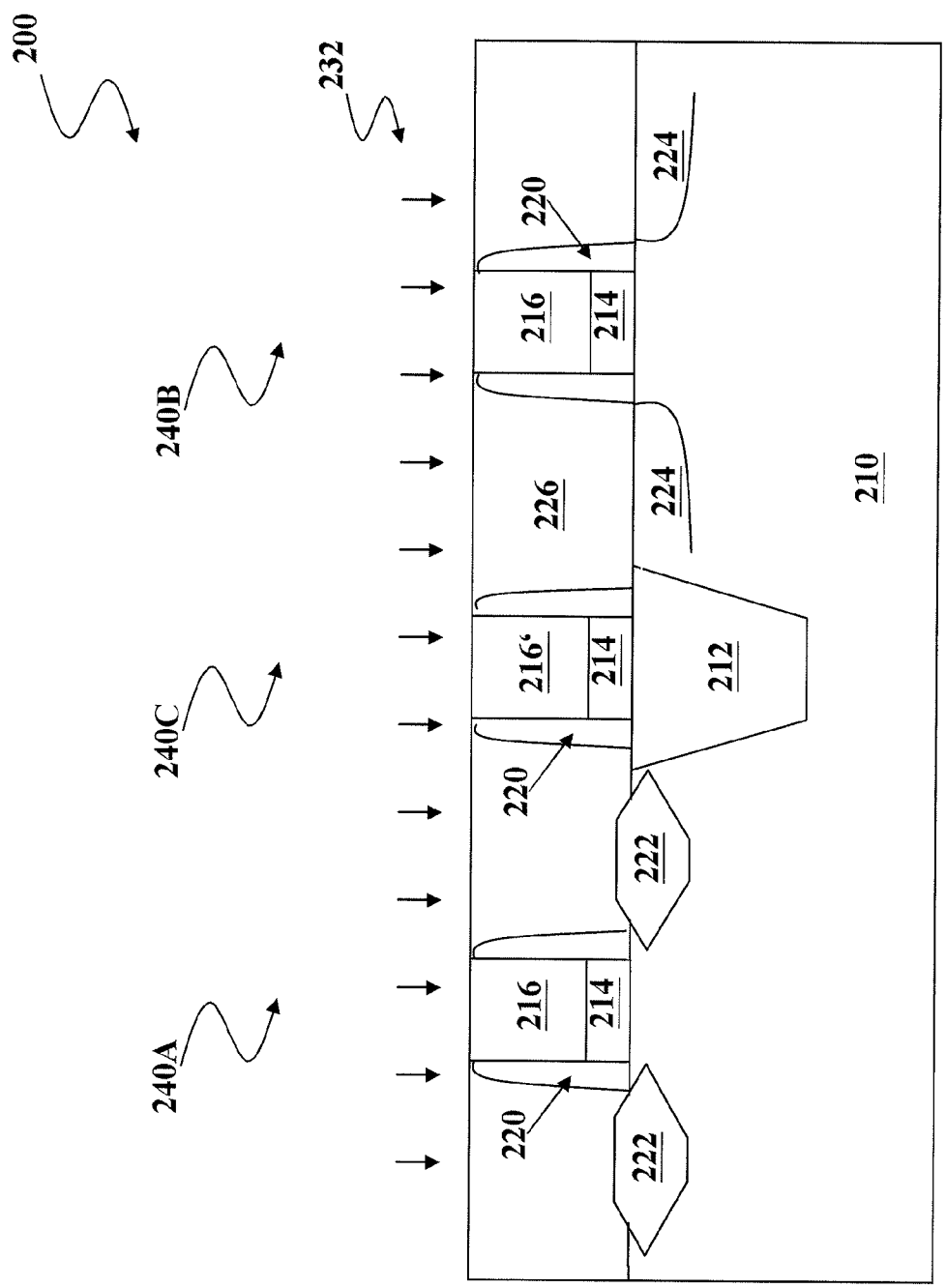

Referring to FIGS. 1 and 8, the method 100 continues with step 114 in which an annealing process 232 is provided to the substrate 210. In some embodiments, the annealing process 232 is provided for diffusion and/or activation of the species distributed in the treated gate electrode feature 216'. In one embodiment, the annealing process 232 is performed at a temperature ranging between about 700° C. and about 1000° C. for a period of time ranging between about 10 sec and about 30 min. In some embodiments, the annealing process 232 is provided by furnace process, RTA (rapid thermal annealing) process, flash anneal, or other suitable process known in the art. In some embodiments, the annealing process 232 oxidizes the treated gate electrode feature 216' by causing a chemical reaction between the oxygen-containing species and the poly-silicon in the treated gate electrode feature 216'. In one embodiment, the poly-silicon is entirely oxidized after the annealing process 232, therefore forming the treated gate electrode feature 216' being composed of silicon oxide. In an alternative embodiment, at least 50% volume of the poly-silicon is oxidized after the annealing process 232, therefore forming the treated gate electrode feature 216' being composed of at least 50% of the silicon oxide and poly-silicon. The treatment 230 and/or the annealing process 232 may form the treated gate electrode feature 216' with a higher resistance or lower conductance than the gate electrode feature 216.

Figure 9:
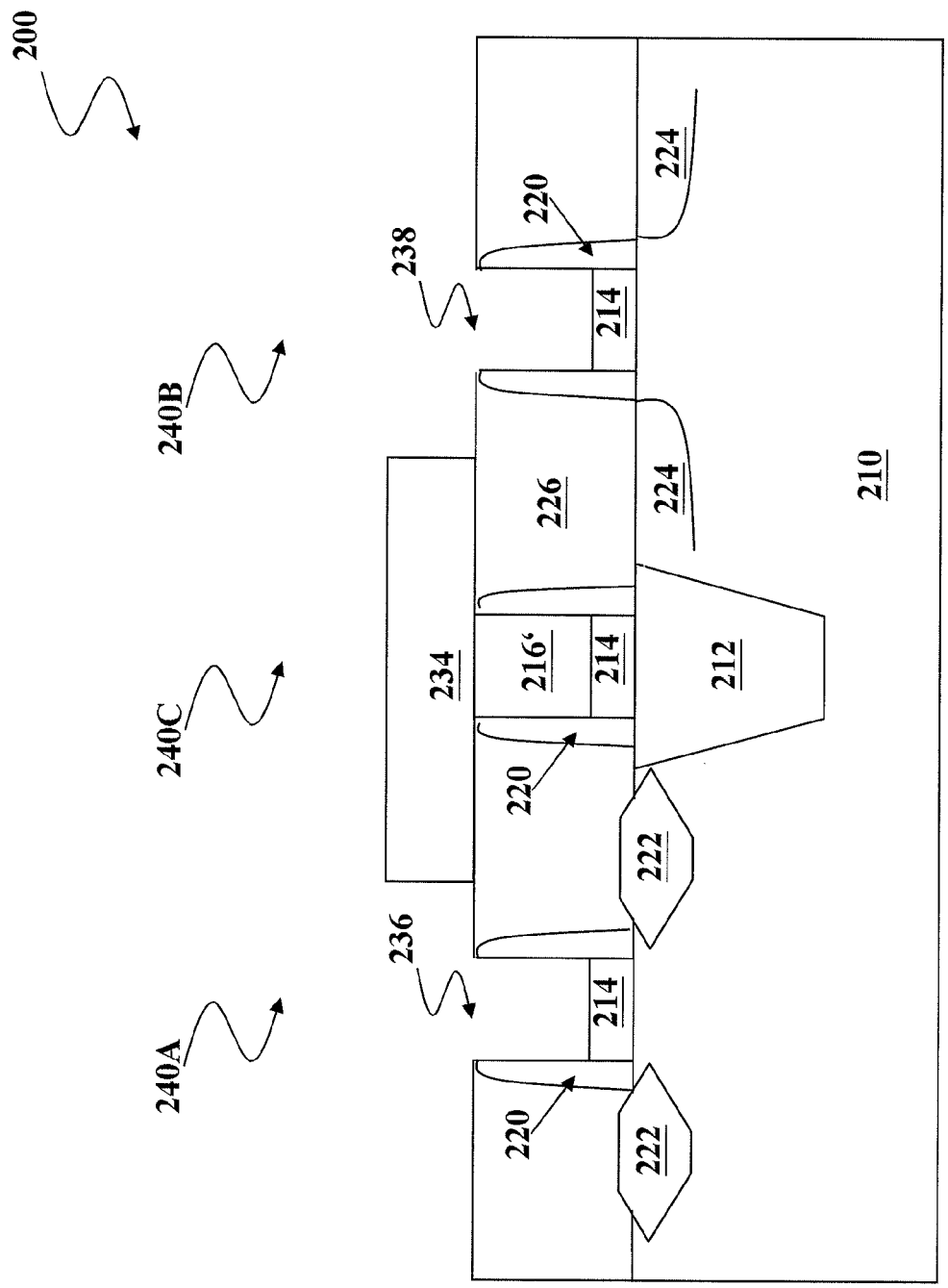

Referring to FIGS. 1 and 9, the method 100 continues with step 116 in which a removing process is provided to remove the gate stacks 240A, 240B to form openings 236, 238, respectively, in the ILD 226. The treated gate electrode feature 216' is not removed in the removing process by providing a protector 234, e.g., a photoresist pattern, thereon. In an embodiment, the removing process removes the gate electrode feature 216 in the gate stacks 240A, 240B but leaves the gate dielectric feature 214 of the gate stacks 240A, 240B if the gate dielectric features 214 comprising a high-k dielectric material. In an alternative embodiment, the removing process removes the gate electrode feature 216 and the gate dielectric feature 214 of the gate stacks 240A, 240B if the gate dielectric feature 214 is not composed of a high-k dielectric material. The removing process can include a dry etch process and/or a wet etch process. In some embodiments, the removing process is a two-step dry etching process comprising a first step to break through (remove) a native oxide (not shown) over the gate electrode feature 216 and a second step to remove the gate electrode feature 216 (e.g., poly-silicon). In some embodiments, the first step of the etching process is performed using $NF_3$ gas and/or argon gas, with flow rates ranging from about 10 sccm to about 100 sccm and from about 10 sccm to about 200 sccm, respectively. In some embodiments, the first step of the etching process is performed with a RF bias greater than about 60V, under a vacuum pressure ranging from about 10 mTorr to about 100 mTorr. In some embodiments the RF bias is between about 60V and about 200V. The second step of the etching process is performed, for example, using Cl gas, HBr gas, He gas, or combinations thereof. In the present embodiment, the flow rates of Cl gas, HBr gas, and He ranges from about 10 sccm to about 100 sccm, from about 200 sccm to about 400 sccm, and from about 100 sccm to about 300 sccm, respectively. In some embodiments, the second step of the etching process is performed with a RF bias less than the RF bias for performing the first step of the etching process. The RF bias for performing the second step of the etching process is, for example, ranging between about 60V and about 200V. In some embodiments, the second step of the etching process is performed under a vacuum pressure ranging from about 10 mTorr to about 100 mTorr. The protector 234 is thereafter removed by a stripping process.

Figure 10:
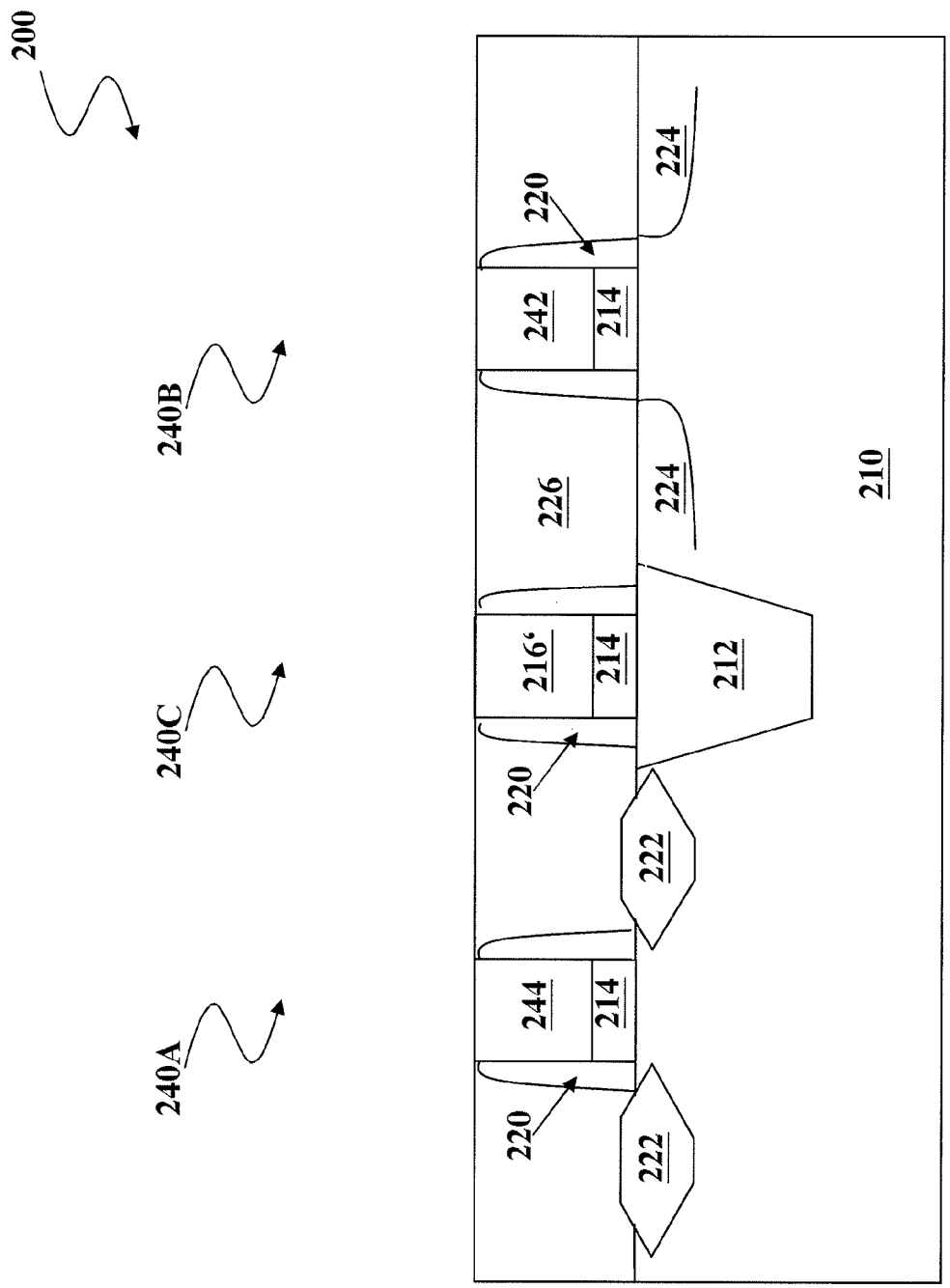

Referring to FIGS. 1 and 10, the method 100 continues with step 118 in which metal gates 244, 242 are formed in the openings 236, 238, respectively. The metal gates 244 242 are formed to replace the gate electrode feature 216 (i.e., poly-silicon gate layer) of the gate stacks 240A, 240B. As mentioned above, the gate stack 240A is designed for PMOS device and the gate stack 240B is designed for NMOS device. The metal gate 244 has a first work function for PMOS device and the metal gate 242 has a second work function for NMOS device. In some embodiments, the metal gates 244, 242 comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials known in the art, and/or combinations thereof.

Subsequent processing may form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The various embodiments of the present disclosure discussed above offer advantage over conventional methods, it being understood that no particular advantage is required for all embodiments, and that different embodiments may offer different advantages. One of the advantages is that the spacing between adjacent conductive gates is increased, therefore reducing the parasitic capacitance among the transistor devices. Hence, the device operation speed may be enhanced to upgrade the device performance. Another advantage is that the likelihood of breakdown of the ILD and/or device failure may be reduced.

One aspect of this description relates to a semiconductor device. The semiconductor device includes an inter-layer dielectric (ILD) layer over a substrate; and a first gate feature in the ILD layer, the first gate feature comprising a first gate material and having a first resistance, wherein the first gate material comprises a first conductive material. The semiconductor device further includes a second gate feature in the ILD layer, the second gate feature comprising a second gate material and having a second resistance higher than the first resistance, wherein the second material comprises at least 50% by volume silicon oxide.

Another aspect of this description relates to a semiconductor device including a first gate electrode over a substrate, the first gate electrode comprising a conductive material. The semiconductor device further includes a dummy gate electrode over the substrate, wherein the dummy gate electrode is on an isolation feature in the substrate, and the dummy gate electrode has a higher resistance than the first gate electrode. The semiconductor device further includes an inter-layer dielectric (ILD) layer between the first gate electrode and the dummy gate electrode.

Still another aspect of this description relates to a semiconductor device. The semiconductor device includes a first gate electrode over a substrate, the first gate electrode comprising a first conductive material; and a second gate electrode over the substrate, the second gate electrode comprising a second conductive material. The semiconductor device further includes a dummy gate electrode over the substrate, the dummy gate electrode between the first gate electrode and the second gate electrode, wherein the dummy gate electrode is on an isolation feature in the substrate, and the dummy gate electrode has a higher resistance than the first gate electrode. The semiconductor device further includes an inter-layer dielectric (ILD) layer between the first gate electrode and the dummy gate electrode, wherein the ILD layer is between the dummy gate electrode and the second gate electrode.

While the disclosure has described by way of example and in terms of preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
   an inter-layer dielectric (ILD) layer over a substrate;
   a first gate stack in the ILD layer, the first gate stack comprising a first gate material and having a first resistance, wherein the first gate material comprises a first conductive material;
   a second gate stack in the ILD layer and separate from the first gate stack, the second gate stack comprising a second gate material and having a second resistance higher than the first resistance, wherein the second material comprises at least 50% by volume silicon oxide, and the first gate stack is substantially free of the second gate material.

2. The semiconductor device of claim 1, wherein the first gate feature comprises a first gate dielectric layer comprising a first dielectric material, and the second gate feature comprises a second gate dielectric layer comprising the first dielectric material.

3. The semiconductor device of claim 1, wherein the second gate feature is over an isolation feature.

4. The semiconductor device of claim 1, further comprising a third gate feature in the ILD layer, the third gate feature comprising a third gate material and having a third resistance, wherein the third gate material comprises a second conductive material.

5. The semiconductor device of claim 4, wherein the second gate feature is between the first gate feature and the third gate feature.

6. The semiconductor device of claim 4, wherein a work function of the first gate material is different from a work function of the third gate material.

7. The semiconductor device of claim 4, wherein the first conductive material and the second conductive material independently comprise at least one of aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, or WN.

8. The semiconductor device of claim 4, wherein the first gate feature is a p-type metal oxide semiconductor (PMOS) transistor, and the third gate feature is an n-type metal oxide semiconductor (NMOS) transistor.

9. The semiconductor device of claim 1, wherein the first gate feature comprises a first gate dielectric layer comprising a first dielectric material, and the second gate feature comprises a second gate dielectric layer comprising a second dielectric material different from the first dielectric material.

10. A semiconductor device comprising:
    a first gate electrode over a substrate, the first gate electrode comprising a conductive material;
    a dummy gate electrode over the substrate, wherein the dummy gate electrode is on an isolation feature in the substrate, a top surface of the dummy gate electrode is substantially planar with a top surface of the first gate electrode, and the dummy gate electrode has a higher resistance than the first gate electrode, and the dummy gate electrode comprises:
- a first portion comprising polysilicon; and
- a second portion comprising silicon oxide wherein the second portion is at least 50% by volume of the dummy gate electrode; and
- an inter-layer dielectric (ILD) layer between the first gate electrode and the dummy gate electrode.

11. The semiconductor device of claim 10, further comprising:
- a first source feature at least partially in the substrate, the first source feature located adjacent to the first gate electrode; and
- a first drain feature at least partially in the substrate, wherein the first gate electrode is between the first source feature and the first drain feature.

12. The semiconductor device of claim 11, wherein a portion of the first source feature extends above a top surface of the substrate, and a portion of the first drain feature extends above a top surface of the substrate.

13. The semiconductor device of claim 11, wherein an entirety of the first source feature is in the substrate, and an entirety of the first drain feature is in the substrate.

14. The semiconductor device of claim 11, wherein the first source feature comprises a strained material, and the first drain feature comprises a strained material.

15. The semiconductor device of claim 11, further comprising:
- a second gate electrode over the substrate, the second gate electrode comprising a conductive material, wherein the dummy gate electrode is between the first gate electrode and the second gate electrode;
- a second source feature at least partially in the substrate, the second source feature located adjacent to the second gate electrode; and
- a second drain feature at least partially in the substrate, wherein the second gate electrode is between the second source feature and the second drain feature.

16. The semiconductor device of claim 15, wherein the second source feature is different from the first source feature, and the second drain feature is different from the first drain feature.

17. A semiconductor device comprising:
- a first gate electrode over a substrate, the first gate electrode comprising a first conductive material;
- a second gate electrode over the substrate, the second gate electrode comprising a second conductive material, wherein a top surface of the second gate electrode is substantially planar with a top surface of the first gate electrode;
- a dummy gate electrode over the substrate, the dummy gate electrode between the first gate electrode and the second gate electrode, wherein the dummy gate electrode is on an isolation feature in the substrate, and the dummy gate electrode has a higher resistance than the first gate electrode, wherein the dummy gate electrode comprises at least 50% by volume silicon oxide; and
- an inter-layer dielectric (ILD) layer between the first gate electrode and the dummy gate electrode, wherein the ILD layer is between the dummy gate electrode and the second gate electrode.

18. The semiconductor device of claim 17, further comprising:
- a first gate dielectric layer between the first gate electrode and the substrate, wherein the first gate dielectric layer comprises a high-k dielectric material;
- a second gate dielectric layer between the second gate electrode and the substrate, wherein the second gate dielectric layer comprises the high-k dielectric material; and
- a dummy gate dielectric layer between the dummy gate electrode and the substrate, wherein the dummy gate dielectric layer comprises the high-k dielectric material.

19. The semiconductor device of claim 17, wherein a work function of the first conductive material is different from a work function of the second conductive material.

20. The semiconductor device of claim 1, wherein a portion of the second material comprises polysilicon.

* * * * *